US010073139B2

(12) United States Patent
Vahidsafa et al.

(10) Patent No.: US 10,073,139 B2
(45) Date of Patent: Sep. 11, 2018

(54) CYCLE DETERMINISTIC FUNCTIONAL TESTING OF A CHIP WITH ASYNCHRONOUS CLOCK DOMAINS

(71) Applicant: Oracle International Corporation, Redwood City, CA (US)

(72) Inventors: Ali Vahidsafa, Palo Alto, CA (US); Sriram Anandakumar, Sunnyvale, CA (US)

(73) Assignee: Oracle International Corporation, Redwood City, CA (US)

( * ) Notice: Subject to any disclaimer, the term of this patent is extended or adjusted under 35 U.S.C. 154(b) by 302 days.

(21) Appl. No.: 14/502,509

(22) Filed: Sep. 30, 2014

(65) Prior Publication Data

US 2016/0091565 A1    Mar. 31, 2016

(51) Int. Cl.
*G01R 31/317* (2006.01)

(52) U.S. Cl.
CPC .. *G01R 31/31726* (2013.01); *G01R 31/31705* (2013.01)

(58) Field of Classification Search
None
See application file for complete search history.

(56) References Cited

U.S. PATENT DOCUMENTS

| | | | |
|---|---|---|---|
| 6,327,684 B1* | 12/2001 | Nadeau-Dostie | G01R 31/3016 714/731 |
| 6,385,236 B1* | 5/2002 | Chen | H04L 25/0266 375/220 |
| 6,553,448 B1* | 4/2003 | Mannion | G06F 5/10 341/98 |
| 6,678,756 B1* | 1/2004 | Tseng | G06F 13/4059 710/29 |
| 6,946,873 B1* | 9/2005 | Sendrovitz | G06F 1/10 326/37 |

(Continued)

OTHER PUBLICATIONS

R. W. Apperson, Z. Yu, M. J. Meeuwsen, T. Mohsenin and B. M. Baas, "A Scalable Dual-Clock FIFO for Data Transfers Between Arbitrary and Haltable Clock Domains," in IEEE Transactions on Very Large Scale Integration (VLSI) Systems, vol. 15, No. 10, pp. 1125-1134, Oct. 2007.*

*Primary Examiner* — Steve Nguyen
(74) *Attorney, Agent, or Firm* — Polsinelli PC

(57) ABSTRACT

Implementations of the present disclosure involve an apparatus and/or method for performing cycle deterministic functional testing of a microprocessor or other computing design with one or more asynchronous clock domains. In general, the method/apparatus involves utilizing an observe bus within the microprocessor design to funnel data from within the chip design to an output bus. In addition, to ensure that the output from the chip is synchronized to a tester clock, the observe bus may feed the information from the observe bus to one or more first-in first-out (FIFO) data buffers. During testing, the data stored in the data buffers may be provided to the output pins of the chip at a rate synchronized to the tester clock such that the output appears to the testing apparatus as being cycle deterministic. Further, one or more mechanisms may be employed within the observe bus or circuit design to control the rate of input of data into the data buffers.

22 Claims, 6 Drawing Sheets

(56) References Cited

U.S. PATENT DOCUMENTS

| | | | |
|---|---|---|---|
| 7,500,164 B2* | 3/2009 | Chelstrom | G01R 31/318552 714/30 |
| 7,958,285 B1* | 6/2011 | Chiu | G06F 5/10 710/52 |
| 9,201,448 B2* | 12/2015 | Menon | G06F 1/12 |
| 2003/0023941 A1* | 1/2003 | Wang | G01R 31/31704 716/103 |
| 2004/0151209 A1* | 8/2004 | Cummings | G06F 1/12 370/503 |
| 2011/0078483 A1* | 3/2011 | Islam | G06F 11/2236 713/400 |
| 2011/0204932 A1* | 8/2011 | Cortadella | G06F 7/00 327/145 |

* cited by examiner

CYCLE DETERMINISTIC FUNCTIONAL TESTING OF A CHIP WITH ASYNCHRONOUS CLOCK DOMAINS

FIELD OF THE DISCLOSURE

Aspects of the present invention relate to computing systems and, more particularly, aspects of the present invention involve an apparatus and/or method for performing cycle deterministic functional testing of a computing design that includes one or more asynchronous clock domains.

BACKGROUND

It is often desirable to improve the efficiency and comprehensiveness of manufacturing testing of computer components. To ensure fast and reliable operation of a computer, manufacturing testing of each part must include some form of speed testing to show that the component is operating within the specified timing parameters. In general, such functional testing includes a tester that provides inputs to the chip and receives an output pattern from the chip. The tester compares the output to an expected value to determine if the chip is operating properly. In addition, the functional testing is typically cycle deterministic in that the tester receives the output from the chip synchronously with the tester clock. The cycle deterministic functional testing of the chip provides the tester with verification of the chips operability.

However, providing cycle deterministic outputs to the tester during the functional testing may be problematic as more and more chips incorporate asynchronous clock domains within the chip design. As a result, the output of the chips to the tester may arrive at either before or after the expected arrival time of the output. Previously, testers have addressed this by conducting the test at a low frequency so that the output to the tester is cycle deterministic. However, such low frequency tests are not at-speed such that an accurate testing of the chip does not occur. Other chip manufacturers provide a synchronous mode design within the chip that allows for cycle deterministic testing. However, such synchronous mode designs consume valuable hardware area and power that cause the chip to operate less efficiently.

It is with these and other issues in mind that various aspects of the present disclosure were developed.

SUMMARY

One implementation of the present disclosure may take the form of a method for functional testing of a microelectronic circuit. The method may include the operations of receiving a plurality of observe data packets from a first location within the microelectronic circuit at an observe bus circuit of the microelectronic circuit, storing the plurality of observe data packets from the first location in one or more first-in, first-out (FIFO) data buffers of the observe bus configured to store the plurality of observe data packets received at the observe bus until the amount of the plurality of observe data packets in the one or more FIFO data buffers exceeds a threshold capacity value of the one or more FIFO data buffers, and providing the stored plurality of observe data packets from the one or more FIFO data buffers to a plurality of output pins at a first frequency, wherein the first frequency is synchronous to a clock signal of a testing apparatus associated with the microelectronic circuit.

Another implementation of the present disclosure may take the form of a computer system comprising a testing device for conducting testing of circuit designs and a microelectronic circuit coupled to the testing device, the microelectronic circuit comprising at least one clock domain and at least one asynchronous domain. In one embodiment, the microelectronic circuit of the system is configured to receive a plurality of observe data packets from a first location within the microelectronic circuit at an observe bus circuit of the microelectronic circuit, store the plurality of observe data packets from the first location in one or more first-in, first-out (FIFO) data buffers of the observe bus configured to store the plurality of observe data packets received at the observe bus until the amount of the plurality of observe data packets in the one or more FIFO data buffers exceeds a threshold capacity value of the one or more FIFO data buffers, and provide the stored plurality of observe data packets from the one or more FIFO data buffers to a plurality of output pins at a first frequency, wherein the testing device is in electrical communication with the plurality of output pins and the first frequency is synchronous to a clock signal of the testing device.

DETAILED DESCRIPTION

Implementations of the present disclosure involve an apparatus and/or method for performing cycle deterministic functional testing of a microprocessor or other computing design with one or more asynchronous clock domains. In general, the method/apparatus involves utilizing an observe bus within the microprocessor design to funnel data from within the chip design to an output bus. In addition, to ensure that the output from the chip is synchronized to a tester clock, the observe bus may feed the information from the observe bus to one or more first-in first-out (FIFO) data buffers. During testing, the data stored in the data buffers may be provided to the output pins of the chip at a rate synchronized to the tester clock such that the output appears to the testing apparatus as being cycle deterministic. Further, one or more mechanisms may be employed within the observe bus or circuit design to control the rate of input of data into the one or more data buffers so that the data buffers do not enter an overflow condition during the testing procedure. Also, one or more control signals may be made available to the testing apparatus to control the observe bus and/or data buffers. As such, through the use of the observe bus design within the chip or computing device, a testing apparatus may conduct a cycle deterministic functional, at-speed testing of the design that does not require an alternative clock mode within the design at the cost of hardware area and consumed power.

Figure 1:
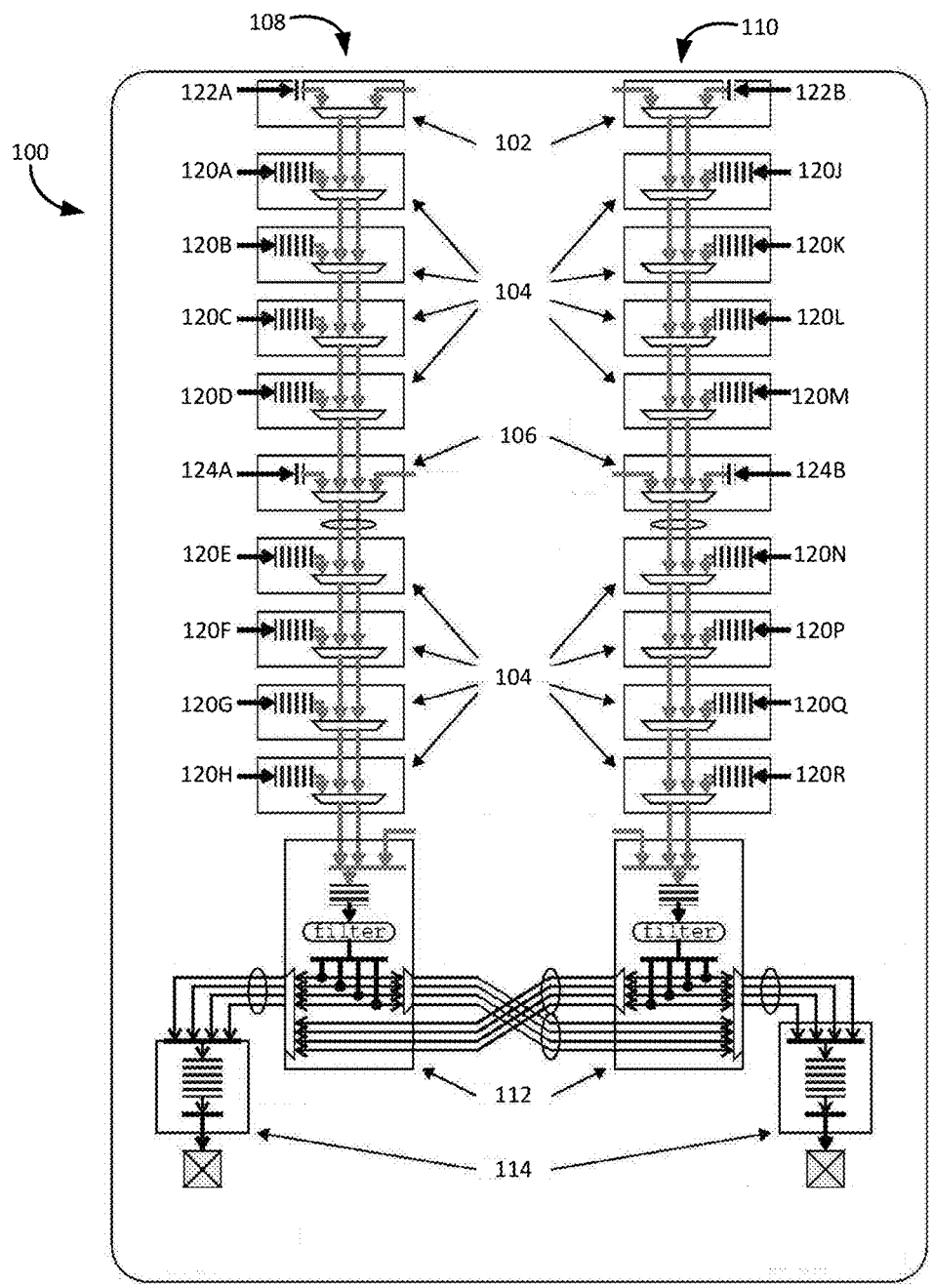
FIG. 1 is a circuit diagram illustrating an example of an observe bus of a microprocessor design which may be used in implementing embodiments of the present disclosure.

FIG. 1 is a circuit diagram illustrating an example of an observe bus of a microprocessor design which may be used in implementing embodiments of the present disclosure. In general, the observe bus 100 may be a portion of a microprocessor or other computing design. Although described herein as a portion of a microprocessor design, the observe bus 100 may be incorporated into any type of computing design. Also, although shown as a collection of functional components and/or circuits, it should be appreciated that the observe bus 100 circuit may include any number of electrical components, such as logical components of a microprocessor.

In general, the observe bus 100 is a high bandwidth pipeline utilized for providing data from one or more points within the microprocessor design to a set of output pins. As such, a testing apparatus or other circuit analyzer may connect to the set of output pins associated with the observe bus 100 to receive data from the one or more points in the microprocessor design. In one embodiment, some or each of the clock domains of the microprocessor design may provide data to the observe bus 100. As shown in FIG. 1, the observe bus 100 may include one or more interfaces 102-106 from the one or more clock domains of the microprocessor connected in a cascading manner to form one or more interface chains. The observe bus 100 in FIG. 1 includes a left-side interface chain 108 and a right-side interface chain 110, with each chain including one or more interfaces 102-106 with the clock domains of the microprocessor. In one embodiment, each interface chain 108-110 may receive data from a specific portion of the microprocessor. For example, the left chain 108 may receive data from clock domains on the left half of the microprocessor design while the right chain 110 may receive data from clock domains on the right half of the microprocessor design. Such division of the interfaces 102-106 of the observe bus 100 may aid the design in keeping distinct areas of the microprocessor design separate during operation. However, as explained in more detail below, the observe data received from the clock domains of the microprocessor may be output on any output pins of the observe bus.

As explained above, the observe bus 100 may include a plurality of interfaces 102-106 from the clock domains of the microprocessor. For example, the observe bus 100 may include a plurality of interfaces 104 corresponding to the one or more processor cores 120A-R of the microprocessor design. The cores may be configured to execute instructions and to process data according to a particular instruction set architecture (ISA). Each of the cores may be configured to operate independently of the others, such that all the cores may execute code in parallel. Additionally, in some embodiments each of the cores may be configured to execute multiple threads concurrently, where a given thread may include a set of instructions that may execute independently of instructions from another thread. For example, an individual software process executing on the microprocessor, such as an application, may consist of one or more threads that may be scheduled for execution by an operating system. In some implementations, each of the cores may be configured to concurrently execute instructions from eight threads, for a total of 64 threads concurrently. In addition, while the present disclosure discusses a multi-core processor, the embodiments described may also be utilized by a single core processor.

The observe bus 100 may also include other interfaces from other clock domains of the microprocessor design. For example, the observe bus 100 may include interfaces 102 for the graphical control units of the microprocessor design, interfaces 106 for the central operating units of the microprocessor design, interfaces for the memory units of the design, and the like. In general, the observe bus 100 may include any number of interfaces 102-106 that receive data from the different clock domains of the microprocessor design. More particularly, the interfaces 102-106 provide a communication interface between points within the microprocessor design from which data concerning the performance of the design is obtained. These points or locations within the design may be associated with the different clock domains of the overall microprocessor design.

As illustrated in FIG. 1, the observe packets from the clock domains of the microprocessor design are received at the interfaces 102-106 at the frequency of the associated clock domain. For example, an observe data packet from clock domain 120A arrives at the associated interface 104 at the frequency of that clock domain. Thus, a clock domain crossing occurs at each interface 102-106 of the observe bus 100. Also, each interface 102-106 includes a multiplexer or other multiplexing type of electronic component(s). Selector signals may be associated with the multiplexers for each interface 102-106 of the observe bus 100 to allow for selection of data from one or more of the observe points within the clock domains of the microprocessor design. For example, a testing apparatus may be configured to analyze observe data from clock domain 120A of the microprocessor design. To obtain data from clock domain 120A, the observe bus may be programmed to assert a selector signal associated with the interface 104 for clock domain 120A. Other selector signals may be asserted for the multiplexers in other interfaces 102-106 of the observe bus. In this manner, the multiplexers for each interface 102-106 may receive a selector signal associated with the interface to allow one of the input signals to the multiplexer to pass through and onto the next interface in the interface chain. As such, through the selector signals of the observe bus 100, data from one or more of the clock domains of the microprocessor design may be transmitted through the interface chains to the output pins of the observe bus.

In one embodiment, the interface chains 108-110 include a filter 112 at the end of the interface chain. As explained in more detail below, the filter 112 of the interface chain 108-110 is programmable to allow passage of some observe data packets and filter out other data packets. Through the use of the filter 112, the number and types of observe data packets being transmitted to the output pins of the observe bus 100 may be programmable. In addition, the filter 112 or filters of the observe bus may electrically connect to one or more first-in first-out (FIFO) data buffers. In particular, observe data packets from the filters are transmitted to and stored in the one or more data buffers. In general, the output of the data buffers may be provided to the output pins of the microprocessor chip at a rate synchronized to the tester clock such that the output appears to the testing apparatus as being cycle deterministic. The data buffers 114 may include one or more control signals such that the parameters of the buffers may be programmable. Control of the data buffers 114 of the observe bus 100 are described in more detail below with reference to FIGS. 2-4.

Through the use of the observe bus 100 of FIG. 1, observe data may be received from a microprocessor or other computing design in a cycle deterministic manner. In other words, to ensure that the output from the chip is synchronized to a tester clock, the observe data stored in the data buffers of the observe bus may be provided to the output pins of the chip at a rate synchronized to the tester clock such that the output appears to the testing apparatus as being cycle deterministic, even though the chip may include one or more asynchronous clock domains. In other words, for those functional tests of the circuit that are cycle deterministic within a particular clock domain of the circuit, the observe data is also provided to the testing device in a cycle deterministic manner through the use of the observe bus. Several control signals may be utilized in relation to the observe bus 100 that aid in controlling the cycle deterministic manner of the output of the observe bus during functional testing of the chip.

Figure 2:
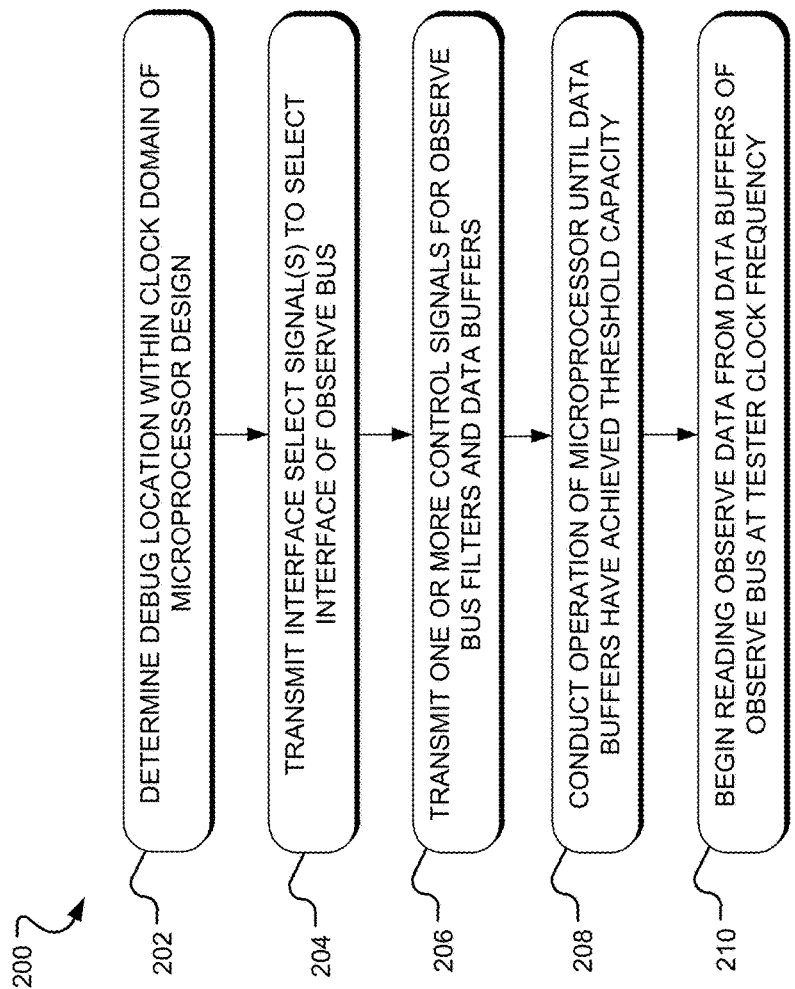
FIG. 2 is a flowchart of a method for utilizing an observe bus of a microprocessor design to perform cycle deterministic testing of the design.

FIG. 2 is a flowchart of a method for utilizing an observe bus of a microprocessor design to perform cycle deterministic testing of the design. The operations of the method 200 may be performed by a testing apparatus during a cycle deterministic functional test of a microprocessor or other microchip. One or more of the operations of the method 200 may also be performed by the chip under test. In general, the method 200 utilizes an observe bus design (such as that illustrated in FIG. 1 and discussed above) to perform a functional test of a microprocessor or other computing-type design that is cycle deterministic to a clock signal of a testing apparatus.

Beginning in operation 202, the testing apparatus determines from which observe location or locations within the microprocessor observe data is retrieved from the chip. Using the observe bus 100 illustrated in FIG. 1 as an example, the testing apparatus may determine that observe information from a clock domain associated with interface 124A is to be analyzed as part of the functional test of the chip. As such, observe information or data from the determined clock domain is provided to the observe bus during testing of the chip. As explained above, however, observe information or data may be obtained from any of the clock domains and/or observe locations within the chip design during functional testing of the chip. Further, in operation 204, the testing apparatus transmits one or more interface select signals to the observe bus for selection of the determined clock domain or observe location. Continue the above example, the testing apparatus may provide an interface select signal associated with interface 124A to select the input to that interface as being transmitted to the output pins of the chip. In particular, the interface select signal may be provided to the multiplexer component(s) within the interface 124A that selects the input from the clock domain associated with that interface. Through the use of the interface select signal, the observe data provided to the interface 124A is transmitted along the interface chain 108 to the filter 112, data buffer 114 and output pins of the chip.

Other interface select signals may also be transmitted to the observe bus during selection of a clock domain to be analyzed. For example, each interface in the interface chain 108 may receive an interface select signal that configures the interfaces to allow for the transmission of observe data along the interface chain. For example, each interface beneath the selected interface in the interface chain 108 may be configured through the use of the interface select signal to allow for propagation of the observe data received at the selected interface along the chain. In general, any number of interface select signals may be provided to the interfaces of the observe bus 100 to configure the interface chains 108-110 to provide a transmission path for the observe data of the selected clock domain or observe location in the chip.

In operation 206, the testing apparatus provides one or more control signals to the observe bus to configure the filters and/or the data buffers of the observe bus. For example, the testing apparatus may provide one or more control signals to configure the filters 112 of the observe bus 100 to pass certain observe data packets while discarding others. In addition, the testing apparatus may provide one or more control signals to configure the data buffers 114 of the observe bus. Such control signals may configure the depth of the data buffers 114 or the read threshold of the data buffers at which reading of the data buffers by the testing apparatus may begin. The control signals utilized to configure the filters 112 and data buffers 114 of the observe bus 100 are described in more detail below with reference to FIGS. 3 and 4. In general, the control signals to the filters 112 and the data buffers 114 may be utilized to control the input rate to the data buffers as well as the reading rate from the data buffers. This control may ensure that the data buffers do not overflow with observe data during the functional testing of the chip.

As mentioned, one configuration of the data buffers 114 for a functional test of the chip is the threshold capacity at which the data buffers may begin being read. Thus, in operation 208, the microchip may operate until the data buffers reach a threshold capacity of stored observe data packets. For example, one embodiment of the observe bus 100 may include data buffers 114 that can be configured to store several thousand observe data packets. The data buffers 114 may be configured during testing to begin a read out when the data packets stored in the data buffers reach a 50% capacity of the buffer. By allowing the data buffers 114 to reach a capacity threshold (such as 50%), the buffers can absorb variability in the input of observe data packets to the buffers. In general, however, the data buffers 114 of the observe bus 100 may be any size (capable of storing any number of observe data packets). Also, the threshold value of the data buffers 114 may be set at any percentage of the data buffers. Once the threshold value is achieved, the testing apparatus may begin reading the stored observe data packets from the data buffers 114 in operation 210. In one particular embodiment, the data packets are read from the data buffers 114 at the clock rate of the testing apparatus such that the testing apparatus receives the stored data synchronously with the tester clock frequency.

Through the use of the observe bus 100 and, in particular, the data buffers 114 of the observe bus, observe data packets from the microprocessor may be provided to the output pins of the microprocessor chip at a steady rate synchronous to a clock frequency. In particular, the data packets may be provided to the output pins of the chip from the data buffers 114 synchronous to a testing clock frequency such that the output appears to the testing apparatus as being on cycle with the tester clock signal. As such, the testing apparatus may perform a cycle deterministic functional test of the chip as the output from the chip is synchronous to the testing clock. This cycle deterministic testing may occur even though the microprocessor may include asynchronous domains or clock domains with varying clock frequencies. In particular, the observe data packets may arrive at the data buffers 114 of the observe bus 100 at varying frequencies, because the data packets are from an asynchronous domain of the chip, only certain types of data packets are passed through the filter 112, the data packets are combined into a representative observe data packet prior to being stored in the data buffers, or for any other operational performance variable of the microprocessor. Regardless of the reason for the frequency at which the observe data packets are written to the data buffers 114, the output to the testing apparatus from the data buffers may be consistent and based on the testing apparatus clock frequency. Thus, through the use of the data buffers 114 of the observe bus 100, variability in the arrival of observe data packets (due to asynchronous portions of the chip design or any other reason) may be provided on the output pins of the chip based on a clock frequency of the testing apparatus. As seen by the testing apparatus, therefore, functional testing of the chip is cycle deterministic to the testing apparatus clock signal.

Several mechanisms may be integrated into the observe bus 100 to account for the variability in data packets written to the data buffers 114 of the bus. For example, as explained above, the data buffers 114 may be initialized with a certain number of data packets before reading out of the data packets by the testing apparatus begins. In the example above, the data buffers 114 may be filled to 50% capacity before read out of the buffers begins. Initializing the data buffers to a threshold value before read out may aid in ensuring that the variability of the storage of the data packets in the buffers does not prevent the read out of the data packets at the testing apparatus clock signal frequency. In other words, the initialization of the data buffers 114 provides a cushion of stored data packets so that a drop in the frequency of stored data packets does not slow the read out of the packets from the buffers.

Another mechanism to control the flow of data packets through the observe bus 100 is the filter 112. As explained above, the filter 112 of the observe bus 100 is programmable to allow passage of some observe data packets and filter out other data packets. For example, during testing of a memory location of the chip, writes to the memory occur on some clock cycles and reads from memory may occur on other clock cycles. However, the testing apparatus may only be concerned with analyzing observe packets during reads to the memory only. In this example, the filter 112 may be programmed to include a filter mask that operates within the filter to drop or otherwise remove observe data packets during writes to the memory and to pass observe data packets during reads from the memory. Through the configuration of the filters, particular observe data packets may be transmitted to the data buffers 114 for analysis by the testing apparatus. Further, limiting the number of data packets sent to and stored by the data buffers 114 may aid in ensuring that the data buffers do not overflow with data packets before the packets can be sent to the output pins of the chip. In some embodiments, the testing apparatus may provide one or more instructions to the chip to program the filters 112 based on the type of test being conducted and the data being analyzed. In other embodiments, the chip may provide the instructions to program the filters 112 based on a request from the testing apparatus. Regardless, the filters 112 may be programmed to pass through any type of observe data packet and/or ignore or drop any other type of data packet. In one particular embodiment, the filters 112 filter the data packets based at least on an address value associated with the data packets.

In a similar manner, the observe bus 100 or chip may combine one or more observe data packets to account for a disparity in the frequency at which data packets are generated from a clock domain of the chip and the frequency at which data packets are transmitted to the output pins of the chip. For example, a simple observe functional test may analyze the output of series of logic components of the chip. In this example, the chip may combine the results of the logic components output and provide the resulting observe data packet to the observe bus 100. As such, the observe data packets for this particular test are not transmitted to the observe bus 100 on each clock cycle of the chip. Rather, depending on the number of combined data packets, the resulting data packet may be transmitted to the observe bus 100 at a slower rate than the chip clock frequency. For example, if 40 observe data packets are combined to create the resulting data packet, the resulting data packet is transmitted on the observe bus 100 every 40 clock cycles of the chip (or more particularly, the clock domain of the chip in which the computations are occurring). In this example, the testing apparatus may be programmed to analyze the resulting data packet transmitted to the observe bus 100. The number of combined data packets to create the resulting data packet transmitted to the observe bus 100 may be any number to adjust the frequency of stored data packets into the data buffers.

Figure 3:
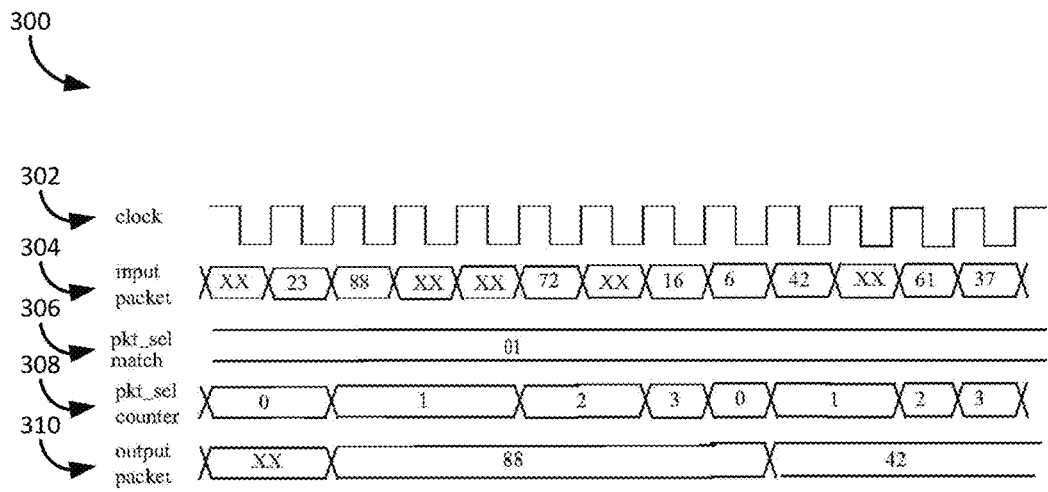
FIG. 3 is a timing diagram illustrating the input and output signals of an observe bus of a microprocessor design for packet slicing during cycle deterministic testing.

In a similar manner, the observe bus 100 may utilize a packet slicing feature of the chip to adjust the frequency of data packet storing in the data buffers 114. In this feature, a counter is utilized to continually count from a zero value to a variable (such as an "n") value, where the variable value is programmable. A selection value (referred to herein as an "m" value) may also be programmed, where m is more than zero but less than n. During testing, the counter continually counts from zero to n and a data packet is transmitted and stored in the data buffers 114 of the observe bus 100 at the occurrence of the m value in the counter. For example, FIG. 3 is a timing diagram illustrating the input and output signals of an observe bus of a microprocessor design for packet slicing during cycle deterministic testing. The timing diagram includes a clock signal 302 at which observe data packets are transmitted to the observe bus. In one embodiment, the clock signal 302 may be the clock signal of a clock domain of the chip from which the observe data packets are transmitted. The stream of observe data packets 304 is also illustrated in the timing diagram 300. The data packets 304 may or may not include a data value corresponding to an observe value from the location within the chip under test.

As discussed above, the packet slicing feature of the observe bus 100 may include an "n" value corresponding to an uppermost value reached by a counter and an "m" value corresponding to selection value at which a data packet is selected from the data packet stream 304. In the timing diagram 300 of FIG. 3, the m value is illustrated as the pkt_sel match signal 306. In this example shown, the m value is binary value "01". However, as described above, the m value may be any value between 0 and the programmed n value. In the timing diagram, the n value is three as the counter signal 308 counts from zero to three. During testing, the chip and/or testing apparatus may utilize the pkt_sel match signal 306 and the pkt_sel counter signal 308 to select data packets from the data packet stream 304. In particular, the data packet from the data packet stream 304 that occurs when the m value 306 matches the counter value 308 is transmitted as the output signal 310 written to the data buffer. As shown in FIG. 3, at counter value one in signal 308 (which matches the m value 306), data packet with value "88" is transmitted as the output signal 310 and written in the data buffer. Another data packet is not transmitted as the output until the counter reaches a one value again, at which point data packet with value "42" is transmitted and stored in the data buffer. In this manner, through programming of the upper limit of the counter signal and the matching selection value 306, the chip and/or testing apparatus may select the frequency at which data packets 304 are written to the data buffers. The selected frequency of data packet writes to the data buffer may aid in preventing overflow of data packets to the data buffer of the observe bus. The n and m values for the packet slicing feature may be provided by the testing apparatus or chip under test.

Figure 4A:
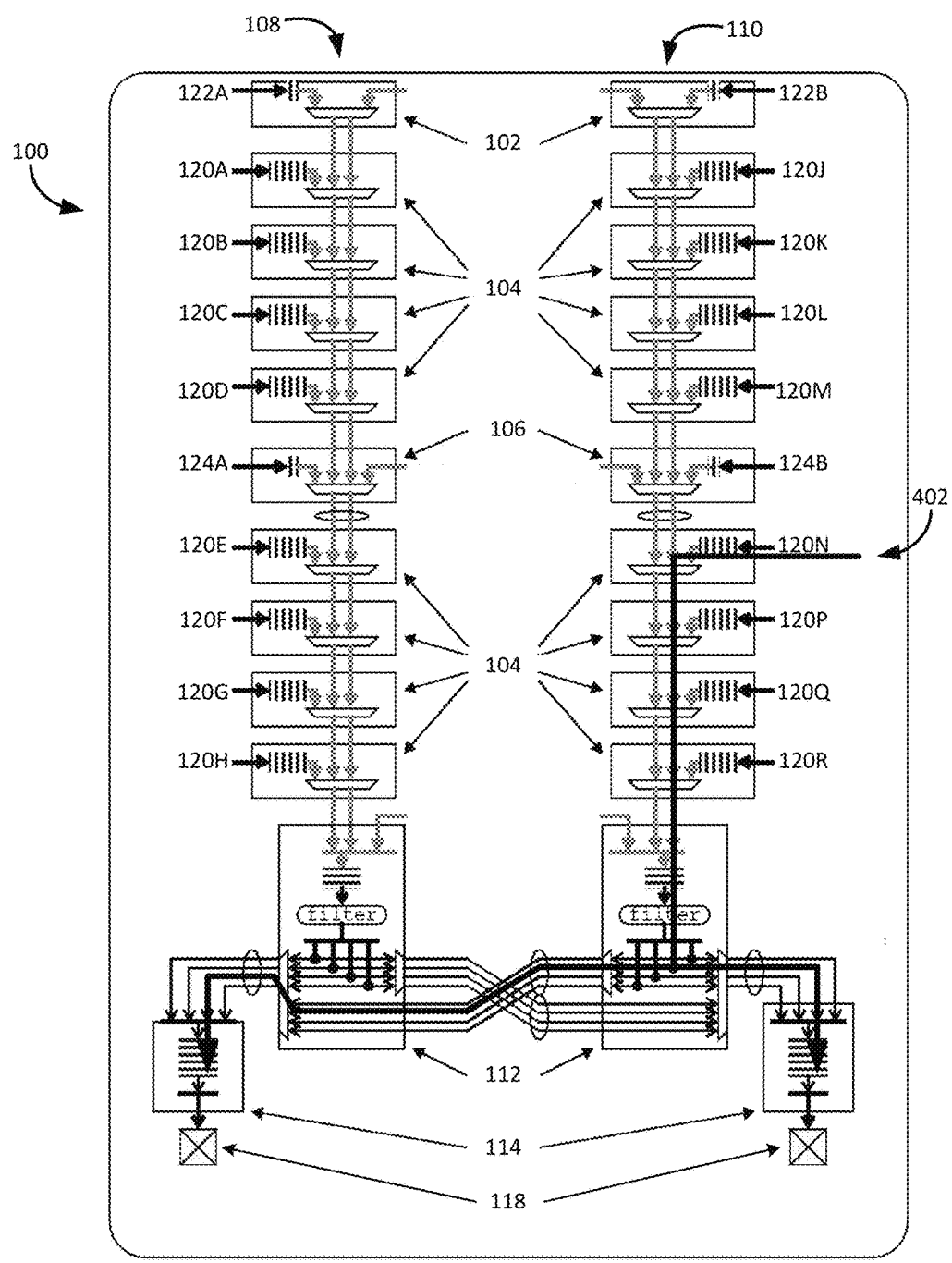
FIGS. 4A and 4B are circuit diagrams illustrating two output modes of an observe bus of a microprocessor design during cycle deterministic testing.
Figure 4B:
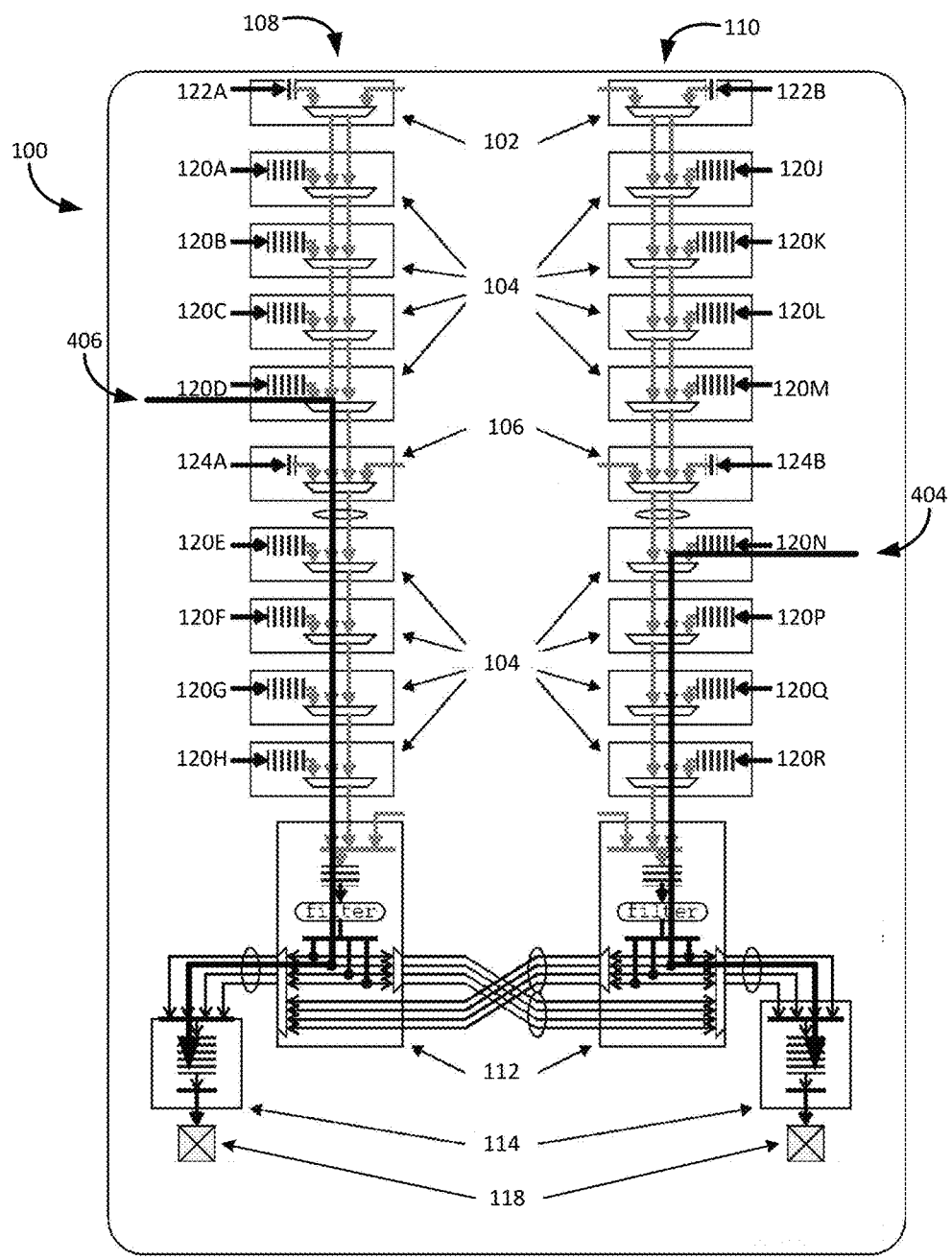

In one embodiment, the observe bus 100 may have two distinct operation modes. In particular, FIG. 4A illustrates a unified operation mode of the observe bus 100 of FIG. 1, while FIG. 4B illustrates a split operation mode of the observe bus. The different operation modes of the observe bus 100 may be programmable by the testing apparatus or the microprocessor during testing of the chip.

In the unified operation mode of the observe bus 100 illustrated in FIG. 4A, a single interface is selected for receiving observe data packets from the chip during testing. In the example shown, interface 120N is the selected interface. Further, in the embodiment shown, the data bus 100 includes two sets of output pins 118, with each set of output pins associated with 40 pins of the chip. In the unified mode, data packets from interface 120N is transmitted to both sets of output pins 118, as illustrated in data flow 402. As such, the observe data packets may be provided as an output of the chip on up to 80 output pins. In one embodiment, a first data packet from the observe bus 100 is sent out on one of the set of 40 output pins and a second data packet is sent on the other set of 40 output pins. In another embodiment, the data packets from the observe bus 100 may be sent out on all 80 output pins at once. As should be appreciated, by alternating the data packets on the two sets of output pins, the frequency at which the data packets are output may be increased.

In the split operation mode of the observe bus 100 illustrated in FIG. 4B, the left and right halves of the observe bus may be kept independent, such that one interface in each half is used to drive the associated output pins. In the example shown in FIG. 4B, interface 120N is the selected interface for the right half of the observe bus 100 and interface 120D is the selected interface for the left half of the observe bus. In this operational mode, observe data packets from interface 120N are provided to the output pins of the right half of the observe bus, as shown by data flow 404. Similarly, observe data packets from interface 120D are provided to the output pins of the left half of the observe bus, as shown by data flow 406. In this manner, data packets from interface 120N are providing on one set of 40 output pins and data packets from interface 120D are providing on the other set of 40 output pins. Operation in split mode allows for the independent operation and testing of halves of the microprocessor. In yet another mode, data packets from the right side of the observe bus 100 may be output on the left side output pins and data packets from the left side of the observe bus may be output on the right side output pins.

Figure 5:
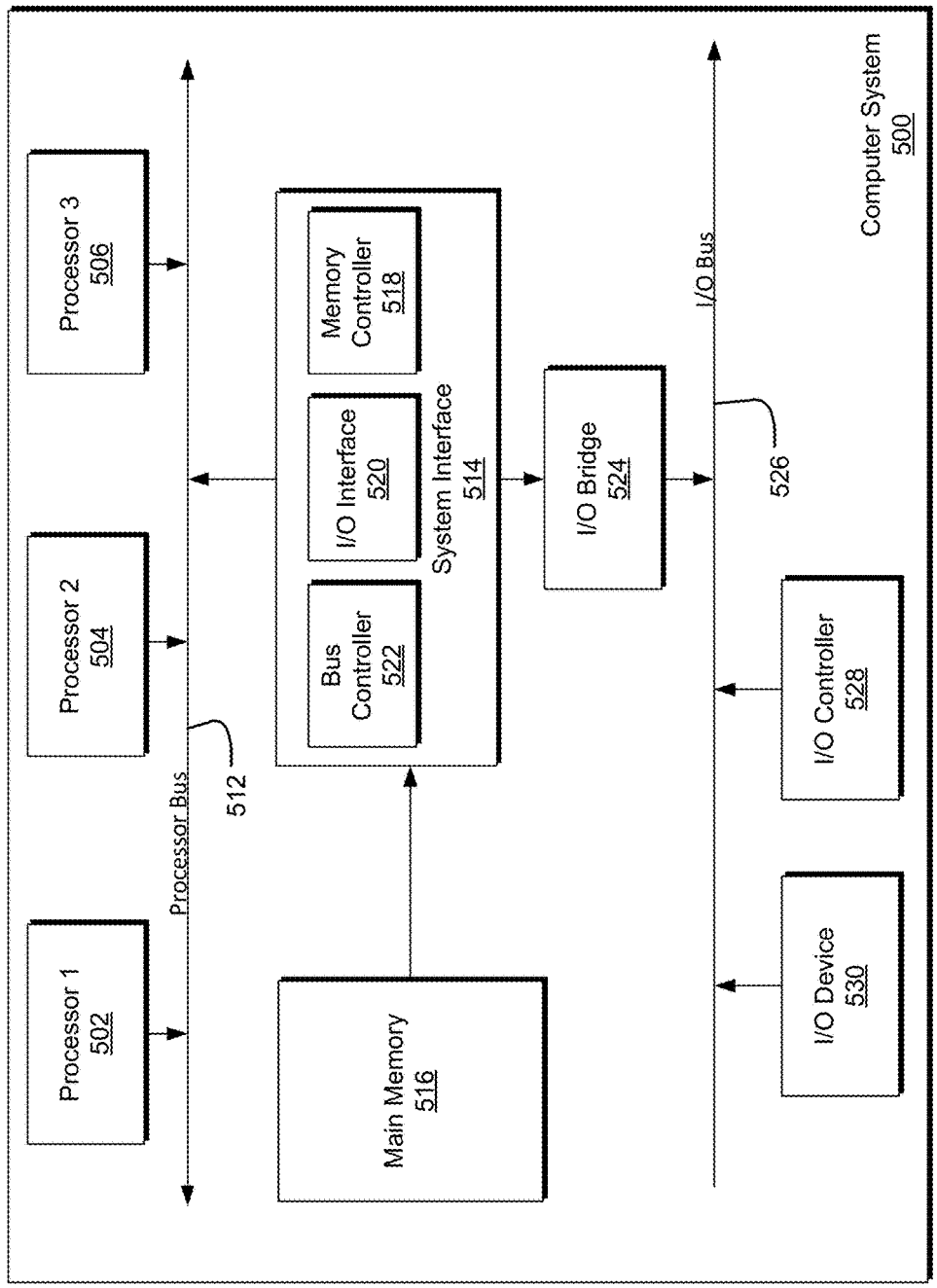
FIG. 5 is a block diagram illustrating an example of a computing system which may be used in implementing embodiments of the present disclosure.

FIG. 5 is a block diagram illustrating an example of a computing device or computer system 500 which may be used in implementing the embodiments of the cycle deterministic functional testing schemes of a circuit design disclosed above. For example, the testing device described above for conducting testing on a circuit may be similar to the computing device of FIG. 5. The computer system (system) includes one or more processors 502-506. Processors 502-506 may include one or more internal levels of cache (not shown) and a bus controller or bus interface unit to direct interaction with the processor bus 512. Processor bus 512, also known as the host bus or the front side bus, may be used to couple the processors 502-506 with the system interface 514. System interface 514 may be connected to the processor bus 512 to interface other components of the system 500 with the processor bus 512. For example, system interface 514 may include a memory controller 518 for interfacing a main memory 516 with the processor bus 512. The main memory 516 typically includes one or more memory cards and a control circuit (not shown). System interface 514 may also include an input/output (I/O) interface 520 to interface one or more I/O bridges or I/O devices with the processor bus 512. One or more I/O controllers and/or I/O devices may be connected with the I/O bus 526, such as I/O controller 528 and I/O device 530, as illustrated.

I/O device 530 may also include an input device (not shown), such as an alphanumeric input device, including alphanumeric and other keys for communicating information and/or command selections to the processors 502-506. Another type of user input device includes cursor control, such as a mouse, a trackball, or cursor direction keys for communicating direction information and command selections to the processors 502-506 and for controlling cursor movement on the display device.

System 500 may include a dynamic storage device, referred to as main memory 516, or a random access memory (RAM) or other computer-readable devices coupled to the processor bus 512 for storing information and instructions to be executed by the processors 502-506. Main memory 516 also may be used for storing temporary variables or other intermediate information during execution of instructions by the processors 502-506. System 500 may include a read only memory (ROM) and/or other static storage device coupled to the processor bus 512 for storing static information and instructions for the processors 502-506. The system set forth in FIG. 5 is but one possible example of a computer system that may employ or be configured in accordance with aspects of the present disclosure.

According to one embodiment, the above techniques may be performed by computer system 500 in response to processor 504 executing one or more sequences of one or more instructions contained in main memory 516. These instructions may be read into main memory 516 from another machine-readable medium, such as a storage device. Execution of the sequences of instructions contained in main memory 516 may cause processors 502-506 to perform the process steps described herein. In alternative embodiments, circuitry may be used in place of or in combination with the software instructions. Thus, embodiments of the present disclosure may include both hardware and software components.

A machine readable medium includes any mechanism for storing or transmitting information in a form (e.g., software, processing application) readable by a machine (e.g., a computer). Such media may take the form of, but is not limited to, non-volatile media and volatile media. Non-volatile media includes optical or magnetic disks. Volatile media includes dynamic memory, such as main memory 516. Common forms of machine-readable medium may include, but is not limited to, magnetic storage medium; optical storage medium (e.g., CD-ROM); magneto-optical storage medium; read only memory (ROM); random access memory (RAM); erasable programmable memory (e.g., EPROM and EEPROM); flash memory; or other types of medium suitable for storing electronic instructions.

It should be noted that the flowcharts of FIG. 2 is illustrative only. Alternative embodiments of the present invention may add operations, omit operations, or change the order of operations without affecting the spirit and scope of the present invention. The foregoing merely illustrates the principles of the invention. Various modifications and alterations to the described embodiments will be apparent to those skilled in the art in view of the teachings herein. It will thus be appreciated that those skilled in the art will be able to devise numerous systems, arrangements and methods which, although not explicitly shown or described herein, embody the principles of the invention and are thus within the spirit and scope of the present invention. From the above description and drawings, it will be understood by those of ordinary skill in the art that the particular embodiments shown and described are for purposes of illustrations only and are not intended to limit the scope of the present invention. References to details of particular embodiments are not intended to limit the scope of the invention.

What is claimed is:

1. A method for functional testing of a microelectronic circuit comprising:
    receiving a plurality of interface select signals from a testing apparatus at an interface of a first location within the microelectronic circuit and at an interface of a second location within the microelectronic circuit, wherein the first location is of a first clock domain with a first clock frequency and the second location is of a second clock domain that is asynchronous;
    receiving a plurality of observe data packets from the first location and the second location at one or more observe bus circuits of the microelectronic circuit in response to the plurality of interface select signals from the testing apparatus;
    storing the plurality of observe data packets from the first location and the second location together in one or more first-in, first-out (FIFO) data buffers of the one or more observe bus circuits configured to store the plurality of observe data packets received at the one or more observe bus circuits until an amount of the plurality of observe data packets in the one or more FIFO data buffers exceeds a threshold capacity value of the one or more FIFO data buffers; and
    providing the stored plurality of observe data packets from the one or more FIFO data buffers to a plurality of output pins at a first output frequency, wherein the first output frequency is synchronous to a clock signal of the testing apparatus associated with the microelectronic circuit.

2. The method of claim 1 wherein the first clock frequency is greater than the first output frequency at which the stored observe data from the one or more FIFO data buffers is provided to the plurality of output pins.

3. The method of claim 1 further comprising:
    receiving at least one buffer control signal; and
    configuring the one or more FIFO data buffers of one or more observe bus circuits in response to the at least one buffer control signal.

4. The method of claim 3 wherein the at least one buffer control signal comprises an indication of the threshold capacity value.

5. The method of claim 4 wherein the threshold capacity value is 50%.

6. The method of claim 1 wherein one or more observe bus circuits further comprises one or more filters configured to analyze the plurality of observe data packets and discard one or more of the plurality of observe data packets.

7. The method of claim 6 further comprising:
    receiving at least one filter control signal; and
    configuring the one or more filters of one or more observe bus circuits in response to the at least one filter control signal.

8. The method of claim 1 further comprising receiving an observe selection signal comprising an indicator of the first location within the microelectronic circuit.

9. The method of claim 1 wherein microelectronic circuit is a microprocessor.

10. A computer system, comprising:
    a testing device for conducting testing of circuit designs; and
    a microelectronic circuit coupled to the testing device, the microelectronic circuit comprising at least one clock domain and at least one asynchronous domain;
    wherein the microelectronic circuit is configured to:
        receive a plurality of interface select signals from the testing device at an interface of a first location and at an interface of a second location within the microelectronic circuit, wherein the first location is of the at least one clock domain with a first clock frequency and the second location is of the at least one asynchronous domain;
        receive a plurality of observe data packets from the first location and the second location at one or more observe bus circuits of the microelectronic circuit in response to the plurality of interface select signals from the testing device;
        store the plurality of observe data packets from the first location and the second location together in one or more first-in, first-out (FIFO) data buffers of the one or more observe bus circuits configured to store the plurality of observe data packets received at the one or more observe bus circuits until an amount of the plurality of observe data packets in the one or more FIFO data buffers exceeds a threshold capacity value of the one or more FIFO data buffers; and
        provide the stored plurality of observe data packets from the one or more FIFO data buffers to a plurality of output pins at a first output frequency, wherein the testing device is in electrical communication with the plurality of output pins and the first output frequency is synchronous to a clock signal of the testing device.

11. The computer system of claim 10 wherein the first clock frequency is greater than the first output frequency at which the stored observe data from the one or more FIFO data buffers is provided to the plurality of output pins.

12. The computer system of claim 10 wherein the microelectronic circuit is further configured to:
    receive at least one buffer control signal; and
    configure the one or more FIFO data buffers of the one or more observe bus circuits in response to the at least one buffer control signal.

13. The computer system of claim 12 wherein the at least one buffer control signal comprises an indication of the threshold capacity value.

14. The computer system of claim 10 wherein the one or more observe bus circuits further comprises one or more filters configured to analyze the plurality of observe data packets and discard one or more of the observe data packets.

15. The computer system of claim 14 wherein the microelectronic circuit is further configured to:
    receive at least one filter control signal; and
    configure the one or more filters of the one or more observe bus circuits in response to the at least one filter control signal.

16. The computer system of claim 15 wherein the at least one filter control signal comprises an indication of an observe data packet type and the one or more filters are configured to accept at least one of the plurality of observe data packets that matches the indication of the observe data packet type of the at least one filter control signal.

17. The computer system of claim 10 further comprising receiving an observe selection signal comprising an indicator of the first location within the microelectronic circuit.

18. A microprocessor comprising:
a first clock domain comprising one or more components that operate based at least on a first clock signal;
at least one asynchronous clock domain; and
one or more observe bus circuits comprising:
   one or more first-in, first-out (FIFO) data buffers configured to store observe data packets received at the one or more observe bus circuits; and
   a plurality of output pins electrically connected to a testing device;
wherein the one or more observe bus circuits are configured to:
   receive a plurality of observe data packets from the asynchronous clock domain and the first clock domain in response to receiving a plurality of interface select signals from the testing device at an interface of the first clock domain and at an interface of the at least one asynchronous clock domain;
   store the plurality of observe data packets from the asynchronous clock domain and the first clock domain together in the one or more FIFO data buffers until an amount of the plurality of observe data packets in the one or more FIFO data buffers exceeds a threshold capacity value of the one or more FIFO data buffers; and
   provide the stored plurality of observe data packets from the one or more FIFO data buffers to the plurality of output pins at a first output frequency, wherein the first output frequency is synchronous to a clock signal of the testing device.

19. The microprocessor of claim 18 wherein the one or more observe bus circuits are further configured to:
   receive at least one buffer control signal; and
   configure the one or more FIFO data buffers of the one or more observe bus circuits in response to the at least one buffer control signal.

20. The microprocessor of claim 18 wherein the one or more observe bus circuits further comprises one or more filters configured to analyze the plurality of observe data packets and discard one or more of the observe data packets.

21. The microprocessor of claim 20 wherein the one or more observe bus circuits are further configured to:
   receive at least one filter control signal; and
   configure the one or more filters of the one or more observe bus circuits in response to the at least one filter control signal.

22. The microprocessor of claim 21 wherein the at least one filter control signal comprises an indication of an observe data packet type and the one or more filters are configured to accept at least one of the plurality of observe data packets that matches the indication of the observe data packet type of the at least one filter control signal.

* * * * *